(12) United States Patent
Liu

(10) Patent No.: US 10,491,727 B1
(45) Date of Patent: Nov. 26, 2019

(54) MOBILE PHONE HOLDER WITH WIRELESSLY ACTIVATED ROBOTIC ARMS AND CHARGER

(71) Applicant: Liu Liu, Shenzhen (CN)

(72) Inventor: Liu Liu, Shenzhen (CN)

(73) Assignee: Valor Communication, Inc., City of Industry, CA (US)

( * ) Notice: Subject to any disclaimer, the term of this patent is extended or adjusted under 35 U.S.C. 154(b) by 0 days.

(21) Appl. No.: 16/279,830

(22) Filed: Feb. 19, 2019

(51) Int. Cl.
*H04M 1/00* (2006.01)
*H04M 1/02* (2006.01)
*H02J 50/12* (2016.01)
*H05K 5/02* (2006.01)
*H05K 7/14* (2006.01)

(52) U.S. Cl.
CPC ........... *H04M 1/0279* (2013.01); *H02J 50/12* (2016.02); *H05K 5/023* (2013.01); *H05K 7/1401* (2013.01)

(58) Field of Classification Search
None
See application file for complete search history.

(56) References Cited

U.S. PATENT DOCUMENTS

| D718,298 S | 11/2014 | Aspinall et al. |
| 2014/0003021 A1 | 1/2014 | Bury |
| 2016/0182698 A1* | 6/2016 | Gordon ................... H04M 1/04 |
| | | 455/575.6 |
| 2018/0252358 A1* | 9/2018 | Yang ................... F16M 13/022 |

FOREIGN PATENT DOCUMENTS

| CN | 206682524 U | 11/2017 |
| CN | 107770337 A | 3/2018 |
| CN | 207427262 U | 5/2018 |
| CN | 297573432 U | 7/2018 |

* cited by examiner

*Primary Examiner* — Erika A Washington
(74) *Attorney, Agent, or Firm* — Thomas I. Rozsa

(57) ABSTRACT

A mobile phone holder for automatically holding or releasing a mobile phone by a pair of grasping arms to allow a user to attach or detach a mobile phone to the mobile phone holder by one-handed operation. The mobile phone holder includes a housing, a holder base, a left robotic arm stretching and extending from the left side of the housing, a right robotic arm stretching and extending from the right side of the housing, and a gear rack and pinion mechanism in the housing for driving the left and right grip arms to move in opposite directions or to synchronize in backward movement. The mobile phone holder further includes a main control circuit board on the main body, a main controller disposed on the main control circuit board, and an a push-button automatic reset travel switch assembly protruding from the front of the housing for detecting the phone.

12 Claims, 10 Drawing Sheets

MOBILE PHONE HOLDER WITH WIRELESSLY ACTIVATED ROBOTIC ARMS AND CHARGER

CROSS-REFERENCE TO RELATED APPLICATION

This patent application claims priority to Chinese Patent Application 201821242547.2 filed on Aug. 3, 2018, now pending.

BACKGROUND OF THE INVENTION

1. Field of the Invention

The field of the invention relates to cell phone holders. Specifically, the present invention relates to a mountable cell phone holder, with an electronic charger.

2. Background

A mobile phone holder is one accessory used to retain and support a mobile phone on a surface. The present inventor has examined existing mobile phone holders and believes that current mobile phone holders have design deficiencies which make them cumbersome to hold when inserting a mobile phone in the mobile phone holder and thereafter placing the mobile phone holder on a surface.

Another design defect in existing mobile phone holders is a requirement for manual two-handed operation by a user when affixing the mobile phone in, or onto the mobile phone holder and/or releasing it from the mobile phone holder. The requirement for a user to have both hands occupied makes it almost impossible to operate the mobile phone until affixation to the mobile phone holder is complete.

The present inventor is aware of an existing prior art product which is a magnetic mobile phone holder that is placed on the upper surface of the mobile phone by using only one hand. In addition, the same product enables the mobile phone to be removed from the upper surface of the product by only one hand. While solving the previously identified problem, the existing prior art magnetic mobile phone holder includes a magnet having a very large magnetic force which interferes with the mobile phone signal and magnetizes the metal parts inside the mobile phone. When used for a long time, it will gradually lead to the following problems: misalignment and malfunction of the mobile phone navigation, the distortion of the phone call quality, disruption of battery life, loss of mobile phone data, the mobile phone screen turning black, and/or the phone crashing intermittently.

In addition, most existing mobile phone holders are only used as a mobile phone accessory that retains and supports a mobile phone. Therefore, there is a significant need for an improved mobile phone holder which resolves problems associated with prior art mobile phone holders.

3. Description of the Prior Art

The following six patents and published patent applications are the closest additional prior art known to the inventor.

1. United States Published Patent Application No. 2014/0003021 to Henryk Bury on Jan. 2, 2014 for "Holding Device for a Portable Communication Device";

2. United States Design Patent No. D718,298 issued to John Aspinall et al. on Nov. 25, 2014 for "Mobile Holder and Mount Assembly";

3. Chinese Patent Publication No. CN206682524U to Zeng Guohui on Nov. 28, 2017 for "Electronic Holding Bracket and Control System Thereof";

4. Chinese Patent Publication No. CN107770337A to Yang Bo on Mar. 6, 2018 for "Intelligent Full-Automatic Mobile Phone Holder and Use Method";

5. Chinese Patent Publication No. CN207427262U to Chen, Zhenneng on May 29, 2018 for "Automatic Clamping Wireless Charging Mobile Phone Support";

6. Chinese Patent Publication No. CN207573432U to Song Min on Jul. 3, 2018 for "An Automatic Clamping a Mobile Phone Support".

SUMMARY OF THE INVENTION

The present invention is a mobile phone holder which will not apply pressure to, or hurt a user's fingers when held in a user's hand. In addition, the present invention includes a housing, a left grip arm and a right grip arm. The present invention mobile phone holder is equipped with a rack and pinion drive mechanism for driving the left grip arm and the right grip arm to move inwardly together to firmly retain a mobile phone. The rack and pinion mechanism is within a housing and extends to the left grip arm movably retained on a left side of the housing and a right grip arm movably retained on a right side of the housing. The rack and pinion mechanism also drives the left grip arm and the right grip arm outwardly in opposite directions to release the mobile phone.

It is an object of the present invention to have a housing which retains a main control circuit board disposed on the main body and a main controller disposed on the main control circuit board.

It is also an object of the present invention to include a housing with a body having a front surface against which a mobile phone is placed and a pair of robotic arms being a left robotic arm extending from a left side of the housing and a right robotic arm extending from a right side of the housing to retain the mobile phone against the front surface of the housing.

It is a further object of the present invention to have a pushbutton automatic reset stroke switch component for detecting the mobile phone to allow the present invention to automatically grip or clamp a mobile phone, and in addition, automatically loosen the grip on the mobile phone.

It is a further object of the present invention to allow a user to place the present invention mobile phone holder on a surface and place the mobile phone on it and push the button to cause the left and right grip arms to retain the mobile phone. Therefore, a user only needs to use one hand to place the mobile phone on the mobile phone holder and have the left and right grip arms retain the mobile phone. The user then has the other hand available to operate the mobile phone.

It is a further object of the present invention to provide a mobile phone holder having a clamping force that is not so strong that it could damage the mobile phone, but which provides a sufficiently strong clamping force to prevent the mobile phone from becoming loose from the holder and falling off.

It is also another object of the present invention to have a mobile phone holder that is able to absorb a vibration when on a surface so that no error in operation will occur on the mobile phone.

Therefore, it is an important object of the present invention to have a self-tensioning mobile phone holder with high reliability and stability.

A significant improvement of the present invention over the prior art is to provide an automatic tensioning mobile phone holder which includes a housing having an opening in a front surface with the automatic tensioning extending from the opening in the middle extending to both a front left side of the housing and to a front right side of the housing to the right. A fixing seat is located at a rear portion of the housing (also referred to as "casing"). A left clamping arm extends from the left side of the casing to the left, and a right clamping arm extends from the right side of the casing. Also included is a rack and pinion transmission mechanism for driving the left clamping arm and the right clamping arm to move simultaneously toward each other for securing the mobile phone and simultaneously away from each other to release the mobile phone.

The mobile phone holder also includes a main control circuit board located in the housing. A main controller of the main control circuit board controls the rack and pinion transmission mechanism. A pushbutton automatic reset travel switch assembly detects the mobile phone which protrudes from an extension end of the front end of the housing. The left end of the left clamping arm has a left clamping portion which protrudes forward for clamping the mobile phone. Similarly, the right end of the right clamping arm has a right clamping portion which protrudes forward for clamping the mobile phone. A portion of the right side of the left clamping arm and a portion of the left side of the right clamping arm are respectively connected with the gear rack transmission mechanism. The gear rack transmission mechanism, the pushbutton automatic reset travel switch assembly, and the main control are electrically connected.

In an initial state, the left clamping arm and the right clamping arm are in an extended state. When the mobile phone is attached to the front end surface of the casing, the pushbutton automatic reset travel switch assembly is pressed by the mobile phone, and the pushbutton automatic reset travel switch assembly gives a first feedback signal after being pressed to transmit a preset distance of 0.2 mm to the master controller. The master controller then directs the rack and pinion mechanism according to the first feedback signal to control the left and right clamping arms with the clamping arms having synchronous movement so that the left clamping arm and the right clamping arm clamp the mobile phone.

When the mobile phone is lifted from the front surface of the casing, the pressing force of the pushbutton automatic reset travel switch assembly is reduced, the pushbutton automatic reset travel switch assembly rebounds, and the pushbutton automatic reset travel switch assembly is caused to be in the rebound preset stroke. A second feedback signal is then sent to the main controller and the main controller controls the rack and pinion transmission mechanism to drive the left clamping arm and the right clamping arm to synchronize back to their starting position to move apart according to the second feedback signal. This movement causes the left clamping portion and the right clamping portion to release the mobile phone.

Preferably, the pushbutton automatic reset travel switch assembly includes a pressing block which extends from a front end surface of the housing, a fixing spring connected between the rear end surface of the pressing block and the front end surface of the main control circuit board. There is also a first switch connected to the main controller and a front end face of the main control circuit board that is connected to the main controller second stroke switch.

The first travel switch and the second travel switch are arranged side-by-side from left to right. The lower portion of the first travel switch has a first elastic button which is movable to the left. A front portion of the second travel switch has a second elastic button having a rearward movement. The present invention also has a rear surface of the pressing block that faces rearward with a gradually decreasing width. A left side of a resisting plate and a right side of the first elastic button has a gap between the elastic button and the resisting plate, with the rear end surface of the pressing block opposite to the position of the second elastic button. The front end surface of the main control circuit board is open so that it is opposite to the position of the resisting plate. The rear surface of the main control circuit board is adapted to move backwards.

When the mobile phone is attached to the front end surface of the casing so that the pressing block is pressed, the pressing block drives the resisting plate to move backward. When the resisting plate moves rearwardly by 0.2 mm, the left side of the resisting plate is opposite to the right side of the first elastic button. When the resisting plate is moved backward by 3 mm, the rear end surface of the pressing block is opposite to the second elastic button.

The stroke of the first elastic button moving to the left and the stroke of the second elastic button moving to the right are preferably both 0.3 mm.

The rack and pinion transmission mechanism includes a reduction gear motor disposed in an up-and-down direction and a gear sleeve on a rotating shaft of the lower end of the reduction gear motor which is fixed in a middle portion of the casing in a left-right direction to enable the inclusion of a slide rail bracket of the gear. A front rack is disposed on the left side of the slide rail bracket and slidable left and right along the front wall of the slide rail bracket. On the right side of the slide rail bracket and along the right side of the rear rack, the rear wall of the slide rail bracket can slide left and right.

The right end of the left clamping arm is integrally connected with the left end of the front rack. The left end of the right clamping arm is connected with the right end of the rear rack to form an integral body. The rear end surface of the front rack is connected with the front side of the gear. The gears on the front end face of the gear rack mesh with the gears on the rear side of the gear rack.

A wireless charging coil is fixed on the front inner wall of the housing and a wireless charging board is fixed on the upper part of the housing. The wireless charging board is connected to the main controller and also to the wireless charging coil. The main control circuit board is further provided with a charging interface and a USB output interface connected to the main controller. A lower bottom surface of the casing is opened to expose the charging interface. The charging interface is a plug interface and a second plug interface exposes the USB output interface.

The battery is a rechargeable battery. The main control circuit board is further provided with a charging protection circuit and a voltage regulating circuit. The charging protection circuit is connected to the charging interface and the rechargeable battery. The voltage regulating circuit is connected between the rechargeable battery and the wireless charging coil. The charging protection circuit and the voltage regulating circuit are also respectively connected to the main controller.

In another embodiment, an annular groove is formed in the middle of the front end surface of the casing and a non-slip rubber gasket is fixed in the annular groove. A right end surface of the left clamping portion and a left end surface of the right clamping portion are each separately affixed with non-slip rubber pads.

In another variation of the present invention, the housing includes an extended opening in the middle of the left and right sides, an open front end surface, and a lower bottom surface which are formed and located at the rear of the housing. The housing also includes a fixing bracket, a left clamping arm extending from the left side of the housing to the left, a right clamping arm extending from the right side of the housing to the right, and a driving device. Also included in the housing is a rack and pinion transmission mechanism for synchronizing the opposite movement of the left clamping arm and the right clamping arm for both closing and opening of the mobile phone holder. As with other embodiments, also included is a main control circuit board disposed in the housing and a control circuit board disposed on the main control circuit board. Also included is a main controller of the rack and pinion transmission mechanism and a pushbutton automatic reset travel switch assembly for detecting a mobile phone in the casing. In addition, the housing includes a cover that is open to the front end surface of the casing and the lower bottom surface of the casing. A pushbutton automatic reset travel switch assembly is connected to the processing panel.

The left end of the left clamping arm has a left clamping portion protruding forwardly for clamping the mobile phone. The right end of the right clamping arm has a right clamping portion protruding forward for clamping the mobile phone. The right side of the left clamping arm and the left side of the right clamping arm are respectively connected with the gear rack transmission mechanism. Also included are the gear rack transmission mechanism, the button type automatic reset stroke switch assembly, and the main control.

In an initial state, the left clamping arm and the right clamping arm are in an extended state. When the mobile phone is attached to the front end surface of the casing, the pushbutton automatic reset travel switch assembly is pressed by the mobile phone, and the pushbutton automatic reset travel switch assembly gives a first feedback signal of 3.2 mm after being pressed. The master controller drives the rack and pinion mechanism according to the first feedback signal which controls the left and right clamping arms toward synchronous movement so that the left clamping arm portion and the right clamping arm portion clamps the mobile phone.

When the mobile phone is lifted from the casing, the pressing force of the pushbutton automatic reset travel switch assembly is reduced and the pushbutton automatic reset travel switch assembly rebounds. The pushbutton automatic reset travel switch assembly is in the rebound preset stroke of 3.2 mm when a second feedback signal is sent to the main controller, and the main controller controls the rack and pinion transmission mechanism to drive the left clamping arm and the right clamping arm to synchronously move back by 3.2 mm to their starting position according to the second feedback signal. This movement causes the left clamping portion and the right clamping portion to release the mobile phone.

The pushbutton automatic reset travel switch assembly includes a pressing block, a fixing spring connected between the rear end surface of the pressing block and a front end surface of the main control circuit board.

The main controller is disposed on the main control circuit board in an up-and-down direction, the first travel switch is connected to the main controller of the front end surface and a second travel switch is connected to the main controller in a front end surface of the main control circuit board in a front-rear direction.

The rear end surface of the pressing panel is fixedly connected with the front portion of the pressing block. The first travel switch and the second travel switch are arranged side-by-side from left to right. The lower portion of the first travel switch has a first elastic button movable to the left. A front end of the second stroke switch has a second elastic button movable backward. A rear end of the pressing block facing rearwardly is provided with a contact plate having a gradually decreasing width. A gap is formed between the left side surface of the resisting plate and the right side surface of the first elastic button. The rear end surface of the pressing block is opposite to the position of the second elastic button and the front end surface of the main control circuit board is opened. The position of the resisting plate is opposite to an opening slot through which the resisting plate passes when moving backward.

When the mobile phone is attached to the pressing panel, the pressing block is pressed so that the pressing block drives the resisting plate to move backward. When the resisting plate moves rearwardly by 0.2 mm pursuant to the first stroke, the resisting plate and the left side surface are opposite to the right side of the first elastic button. When the resisting plate is moved backward by 3 mm of the second stroke, the rear end surface of the pressing block is opposite to the second elastic button.

The rack and pinion transmission mechanism includes the following: (i) a reduction gear motor disposed in an up and down direction and a gear sleeved on a rotating shaft of the lower end of the reduction gear motor that is fixed in a middle portion of the casing in a left-right direction to enable the inclusion of a center of a slide rail bracket of the gear, (ii) a front rack that is disposed on the left side of the slide rail bracket, slidable left and right along the front wall of the slide rail bracket, and disposed on the right side of the slide rail racket; (iii) and along the right side, a rear rack in which the rear wall of the slide rail bracket can slide left and right.

The right end of the left clamping arm is integrally connected with the left end of the front rack. The left end of the right clamping arm is connected with the right end of the rear rack to form an integral body. The rear end surface of the front rack meshes with the front side of the gear meshes. The front end face of the rear rack meshes with the rear side of the gear.

The benefits of the present invention are further discussed below.

First, the present invention provides a highly reliable automatic tensioning mobile phone holder so that when the user's mobile phone needs to be placed on a surface, the user single-handedly attaches the mobile phone to the mobile phone holder. The front end surface of the casing can be combined and when the user attaches the mobile phone to the front end surface of the casing with one hand, the pushbutton automatic reset travel switch protruding from the front end surface of the casing is pressed. The pushbutton automatic reset travel switch assembly will give a preset 3 mm first feedback signal to the main controller after being pressed by the first present stroke, and the main controller will control the device according to the first feedback signal. The gear rack drive mechanism drives the left clamping arm and the right clamping arm to move in opposite directions so that the left clamping portion and the right clamping portion clamp the user's mobile phone when the user needs to operate the phone with only one hand. The user only needs to lift the mobile phone with one hand. When the user lifts the mobile phone with one hand, the pressing force of the pushbutton automatic reset travel switch assembly is reduced, so that the pushbutton automatic reset travel switch assembly rebounds. The automatic reset travel switch knob assembly will rebound by 3 mm after a predetermined second stroke feedback signal is sent to the master controller. The master controller then moves the gear rack according to the second feedback control signal. The transmission mechanism drives the left clamping arm and the right clamping arm to move back in synchronization to release the left clamping portion and the right clamping portion from the user's mobile phone.

Therefore, the present invention provides automatic operation of the user's mobile phone. The clamping and loosening enable the user to operate with only one hand so the other hand is free to do other things. When the application is used as a car phone holder, the user can free one hand to operate the steering wheel. When the user's hands are away from the steering wheel, the steering wheel cannot be quickly operated in the event of an unexpected situation, to thereby prevent the vehicle from being out of control and causing a traffic accident.

Once the pushbutton automatic reset travel switch assembly is pressed, the 3 mm first stroke gives a first feedback signal to the main controller. The left and right holding portion and the holding portion clamping the phone travel to the main controller after a reset second feedback signal. The pushbutton automatic reset travel switch assembly is slightly pressed to clamp the mobile phone. When the reset switch is again pressed, the mobile phone is released. The feedback signal needs to have the reset button move at least 3.2 mm. to confirm that the mobile phone is grasped by a clamping arms. A movement of less than 3.2 mm indicates that the mobile phone was not properly affixed and is not being grasped by the clamping arms. Controlling the rack and pinion transmission mechanism drives the left clamping arm and the right clamping arm to be synchronously stretched, thereby enabling the present invention to recognize whether the mobile phone fits in place and can withstand external slight vibrations or slight shaking.

When the mobile phone press stroke is less than 32 mm, the left clamping arm and the right clamping arm do not synchronously move toward each other to clamp the mobile phone. When the present invention is fixed on the vehicle center console and its periphery through the fixing seat, even if the car encounters a certain degree of impact such as bumps, vibration or shaking during the time the car is being driven, as long as the force creates a rebound stroke movement of less than 3.2 mm, the mobile phone will not become loosened from the present invention and the left and right clamping arms will still apply pressure to the mobile phone. Compared with the infrared induction method and the elastic-type stroke switch assembly of the prior art, the present invention is an improvement over the prior art since the infrared sensing method is avoided.

The principle of the rack and pinion transmission is to control the automatic clamping of the left clamping arm and the right clamping arm so that the moving positions of the left clamping arm and the right clamping arm are accurate without deviation. When the left clamping arm and the right clamping arm move toward each other to clamp the mobile phone, no matter how long the mobile phone is used, the clamping force of the mobile phone will be constant. For a default preset stroke limit for clamping, there is a deviation caused by the stroke using the problem of poor stability. Therefore, to reduce power loss and wear of mechanical parts, the limited switch assembly snap elasticity deforms after long use.

This variation is the same as the first automatic self-tensioning mobile phone support with the difference being that it also includes a pressing panel connected to the pushbutton automatic reset stroke switch assembly which is open to the front end surface of the casing and the lower bottom surface so that the pushbutton automatic reset stroke switch assembly is hidden. Therefore, from the front view, the front end surface of this variation of the present invention is a planar structure or a nearly planar structure.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DETAILED DESCRIPTION OF EMBODIMENTS OF THE PRESENT INVENTION

Figure 1:
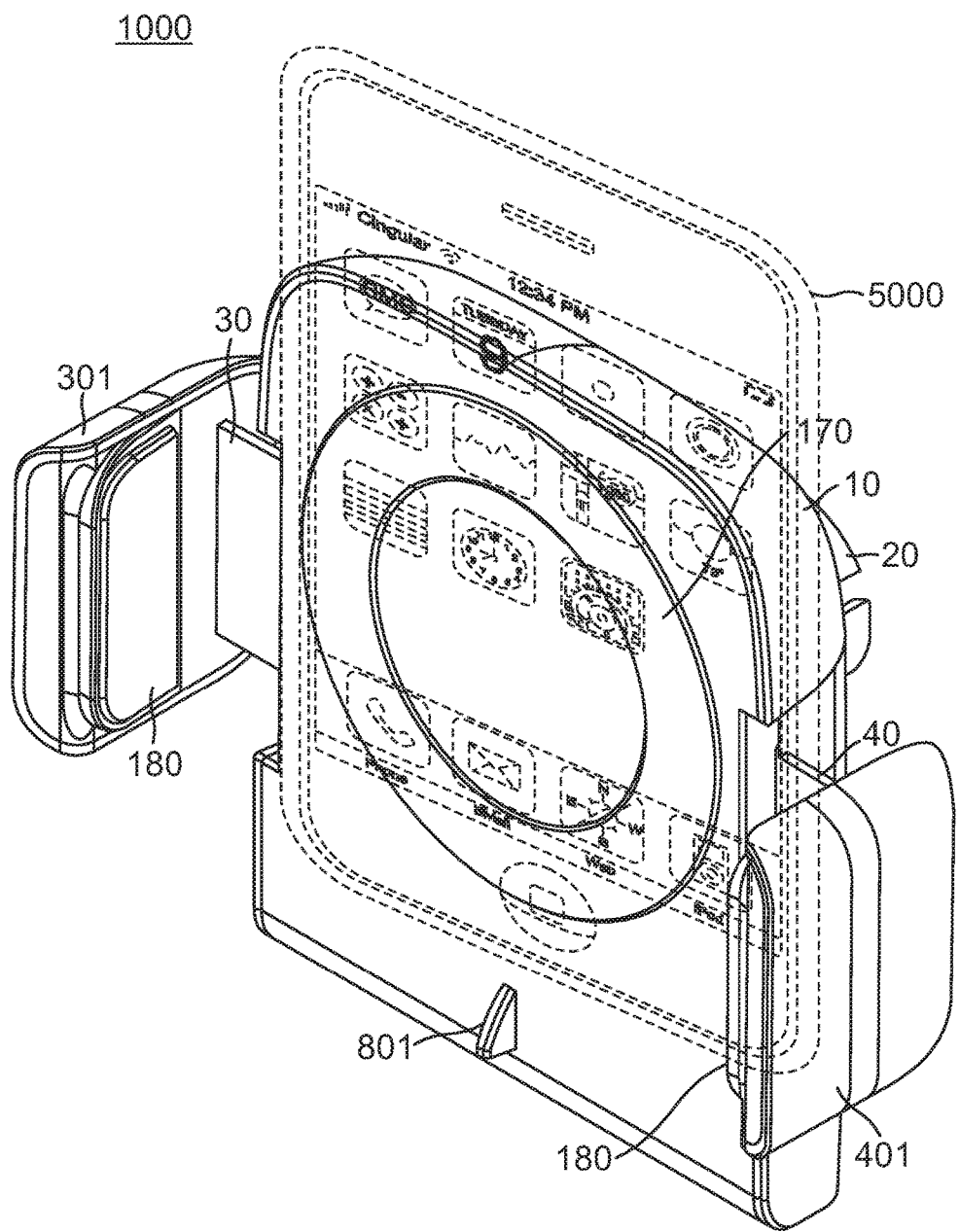
FIG. 1 is a front perspective view of a first embodiment of the present invention automatic mobile phone grasping arms and location where the mobile phone holder retains a mobile phone including a pressing block extending from the front surface.
Figure 2:
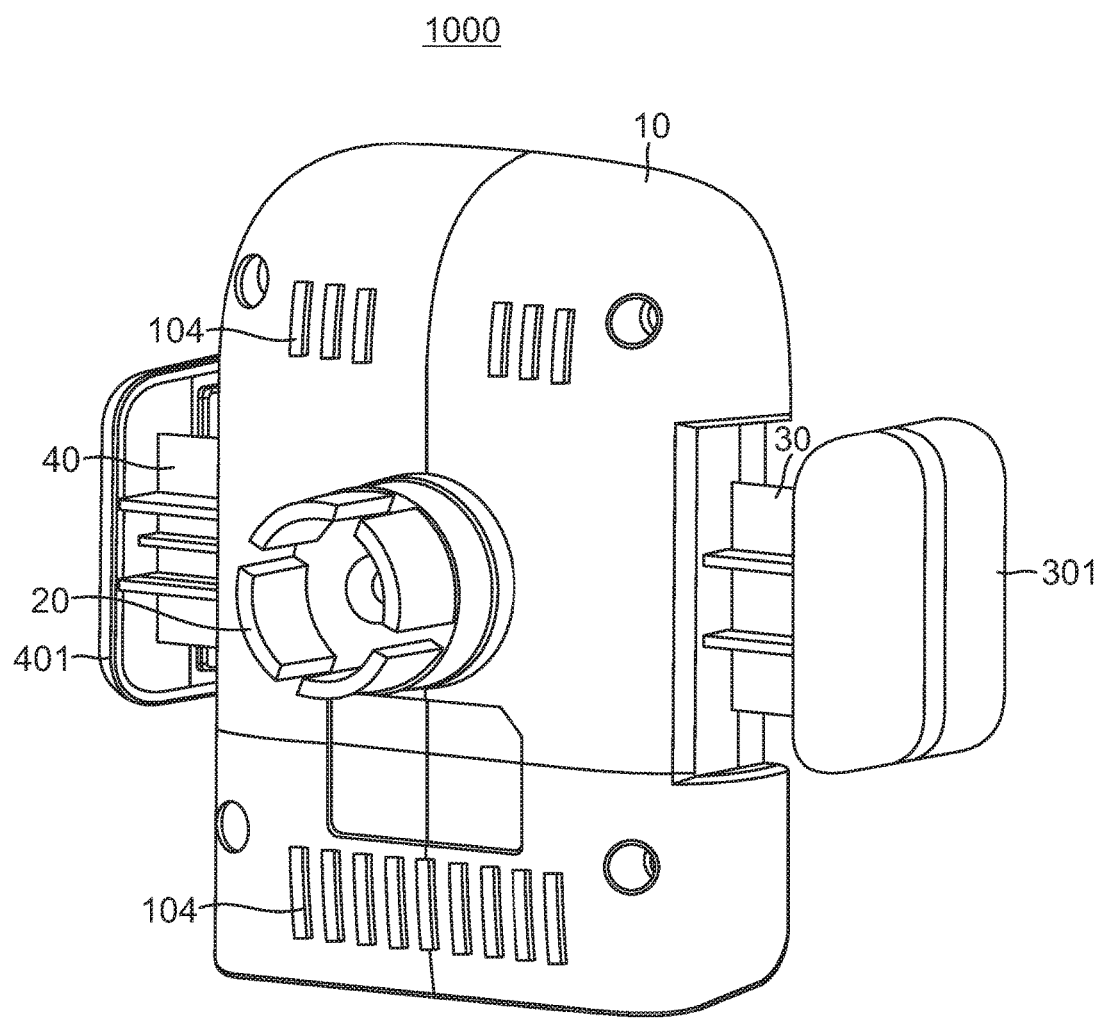
FIG. 2 is a rear perspective view of the present invention automatic mobile phone grasping and location where the mobile phone holder retains a mobile phone.

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

The technical solutions of the present invention will be described in detail below in conjunction with the accompanying drawings and specific embodiments, in order to more clearly and intuitively understand the invention.

Embodiment 1

Referring to FIGS. 1 through 9, the present invention provides a mobile phone holder 1000 automatically reliably holding or releasing a mobile phone (shown in dashed lines as number 5000 in FIG. 1) which mobile phone holder 1000 comprises a housing 10 provided with an extending opening in the middle and front sides of the left and right sides, and a fixing base 20 disposed at the rear of the housing 10. Housing 10 extends from the left wall 130 to an area 132 left of the housing opening 160 extending to an area 140 to the right of the housing outlet 160 to the right wall 140. From the left side wall 130 of the housing 10 an outwardly projecting left clamping arm 30 extends and from the right side wall 140 of the housing an outwardly projecting right clamping arm 40 extends. Housing 10 has a transmission mechanism 50 (see FIG. 3) in gear rack drive 502 driving the left clamping arm 301 and the right clamping arm 401 simultaneously toward each other for clamping the mobile phone 5000 and releasing the mobile phone 5000 back to their starting position.

Figure 3:
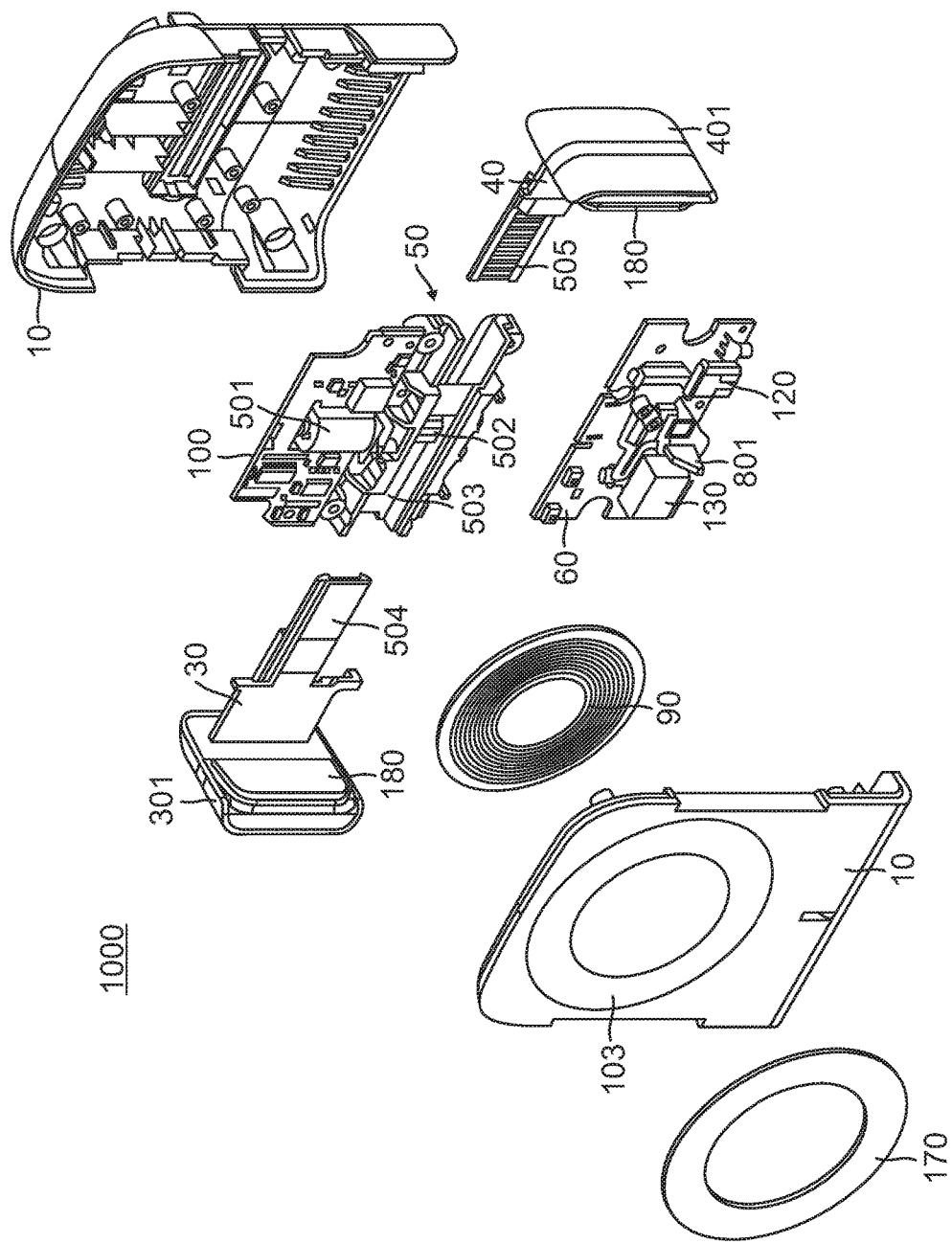
FIG. 3 is an exploded view of the present invention housing having the automatic mobile phone grasping arms.
Figure 5:
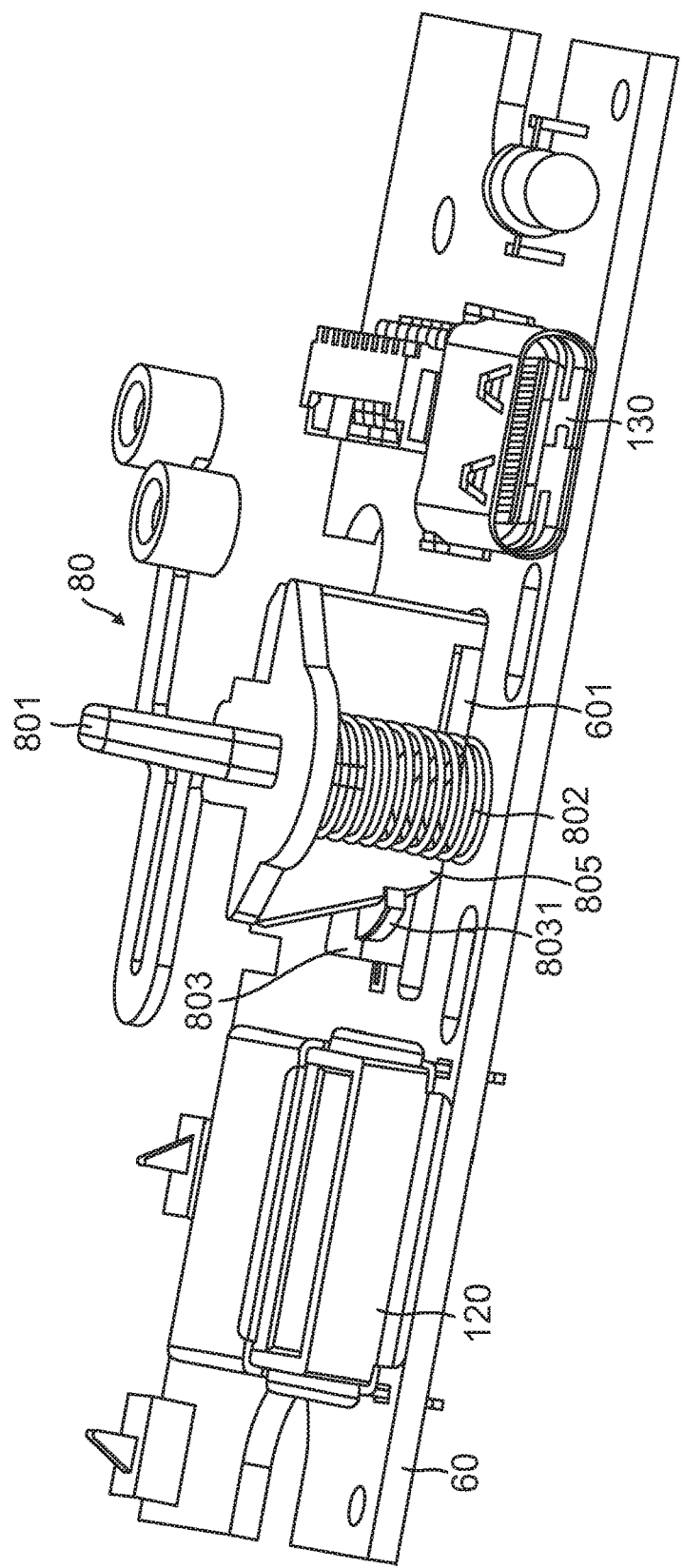
FIG. 5 is an interior front perspective view of the pushbutton automatic reset travel switch assembly and a circuit board connected to the master.

The rotational synchronized movement of the clamping arms 301 and 401 away from each other or toward each other is created by the transmission mechanism 50. Also illustrated in FIG. 3 is the main circuit board 60 (see FIG. 5) within the housing 10, the main controller 70 in main circuit board 60 driving the transmission mechanism 50 in gear rack 502 in main controller 70. Also illustrated in FIG. 5 is the pushbutton automatic reset travel switch assembly 80 for detecting the mobile phone extending from the front end of housing 10. Referring to FIGS. 1 and 3, the left end of the left clamping arm 30 has a left clamping portion 301 protruding forwardly for clamping the mobile phone. The right end of the right clamping arm 40 has a right clamping member 401 protruding forward for clamping the mobile phone. The present invention also includes a holding section 401, left clamping arm 30 and right clamping arm 40 are interlocking with the transmission mechanism 50 in gear rack 502 respectively. The transmission mechanism 50 in gear rack 502 and the pushbutton automatic reset travel switch assembly 80 are respectively connected with the main controller 70.

In the initial state, the left clamping arm 30 and the right clamping arm 40 are in an extended state. When the mobile phone is placed to fit in the front surface of the housing 10, the pushbutton automatic reset travel switch assembly 80 is pressed by the mobile phone 5000 and the pushbutton automatic reset travel switch assembly 80 gives a first feedback signal of 3.2 mm to the master controller 70 after being pressed. According to the first feedback signal, the master controller 70 controls the transmission mechanism 50 in gear rack 502 to drive the left clamping arm 30 and right clamping arm 40 to synchronously move towards each other. In this way, the left clamping portion 301 and right clamping portion 401 can securely grip and hold the mobile phone.

When the mobile phone is slightly lifted from its position, the pressing force of the pushbutton automatic reset travel switch assembly 80 is reduced, and the pushbutton automatic reset travel switch assembly 80 rebounds. The pushbutton automatic reset travel switch assembly 80 now triggers a second feedback signal for the reset travel switch to move 3.2 mm and the signal is sent to the main controller 70. According to the second feedback signal of 3.2 mm of the reset travel switch, the main controller 70 controls the transmission mechanism 50 in the gear rack to drive the left clamping arm 30 and right clamping arm 40 to synchronously move apart from each other. In this way, the left clamping portion 301 and right clamping portion 401 release the mobile phone.

When the mobile phone needs to be affixed to the housing 10, a mobile phone user can place the mobile phone on the front of the housing 10 using only one hand. When the user places the mobile phone on the front-end surface of the housing 10 with one hand, the pushbutton automatic reset travel switch assembly 80 protruding from the protruding end of the front-end surface of the housing 10 is pressed. The pushbutton automatic reset travel switch assembly 80 gives a first feedback preset signal to move the reset travel switch by 3.2 mm to the master controller 70 after being pressed. In response to the first feedback preset signal of 3.2 mm, the master controller 70 drives transmission mechanism 50 in gear rack 502 to drive the left clamping arm 30 and right clamping arm 40 to synchronously move towards each other. In this way, the left clamping portion 301 and right clamping portion 401 can securely grip and hold the mobile phone. When the user needs to take the phone, the user only needs to lift the mobile phone with one hand. When the user lifts the mobile phone with one hand, the pressing force of the pushbutton automatic reset travel switch assembly 80 is reduced and the pushbutton automatic reset travel switch assembly 80 rebounds. The pushbutton automatic reset travel switch assembly 80 now triggers a second feedback preset signal of 3.2 mm and the signal is sent to the main controller 70. In response to the second feedback preset 3.2 mm signal, the pushbutton automatic reset travel switch assembly 80 moves in the opposite direction by 3.2 mm and the main controller 70 drives the transmission mechanism 50 in gear rack 502 to control the left clamping portion 301 and right clamp portion 401 to synchronously move apart from each other. In this way, left clamping portion 301 and right clamping portion 401 release the mobile phone.

Therefore, the present invention automatically clamps and releases the user's phone. The clamping and loosening enable the user to operate with the mobile phone with one hand so that the other hand is free to do other things. When the application is used as a car phone holder, the user can free one hand to operate the steering wheel to avoid both hands being away from the steering wheel which can effectively help a driver avoid accidents.

The pushbutton automatic reset travel switch assembly 80 gives a first 3.2 mm feedback signal to the master controller 70 after being pressed so left clamping portion 301 and right clamp portion 401 release the mobile phone. A second 3.2 mm feedback signal is sent back to the master controller 70 by the pushbutton automatic reset travel switch assembly 80 so left clamping portion 301 and right clamping portion 401 release the mobile phone. When fixed by the fixing base 20, the pushbutton automatic reset travel switch assembly 80 is slightly pressed or slightly rebounded due to the pressing force reduction and the main controller 70 will not receive the feedback signal so that it is not too sensitive to control transmission mechanism 50 in gear rack 502 to drive the left clamping arm and the right clamping arm to be synchronously stretched. Accordingly, the present invention identifies if the phone fits in place and adapts to external forces such as impacts and shaking. If the mobile phone does not fit in place, the mobile phone press is insufficient. When the mobile phone stroke is less than 3.2 mm, the left clamping arm 30 and the right clamping arm 40 do not synchronously move toward each other to clamp and hold the mobile phone. When the present invention is fixed on the vehicle center console and its periphery by the fixing base 20, even if the car experiences bumps, vibration or shaking during the running process, as long as the impact forces are less than 3.2 mm, the left clamping arm 30 and right clamping arm 40 will not synchronously move against each other to release the cell phone.

The present invention's pushbutton automatic reset travel switch assembly 80 driven by the pressure to generate a feedback signal works more effectively compared with the prior art infrared induction method and the elastic-type stroke switch assembly. It can prevent problems from power loss due to red infrared sensing other user's mobile phones and mechanical component wear, and prevent instability problems from deviation from the preset strokes of 3.2 mm due to prolonged use of springs.

At the same time, the present invention adopts the principle of the transmission mechanism 50 in gear rack 502 to control the automatic clamping of the left clamping arm 30 and the right clamping arm 40 so that the moving positions of the left clamping arm 30 and the right clamping arm 40 are accurate without deviation. When the left clamping arm 30 and the right clamping arm 40 move toward each other to clamp the mobile phone, no matter how long the mobile phone is used, the clamping force on the mobile phone will be constant. Therefore, the phone will not be clamped too tight to break nor too loose to fall.

The pushbutton automatic reset travel switch assembly 80 is composed of a pressing block 801 extending from an extending end of the front-end surface of the housing 10, a fixing spring 802 (see FIG. 5) connected between the rear end surface of the pressing block 801 and the front-end surface of the main control circuit board 60, a first travel switch 803 connected to the main controller 70 which is set in an up-and-down direction at the front end of the main control circuit board 60, and a second travel switch 804 (see FIG. 6) connected to the main controller 70 which is set in an up-and-down direction at the front end of the main control circuit board 60.

Figure 6:
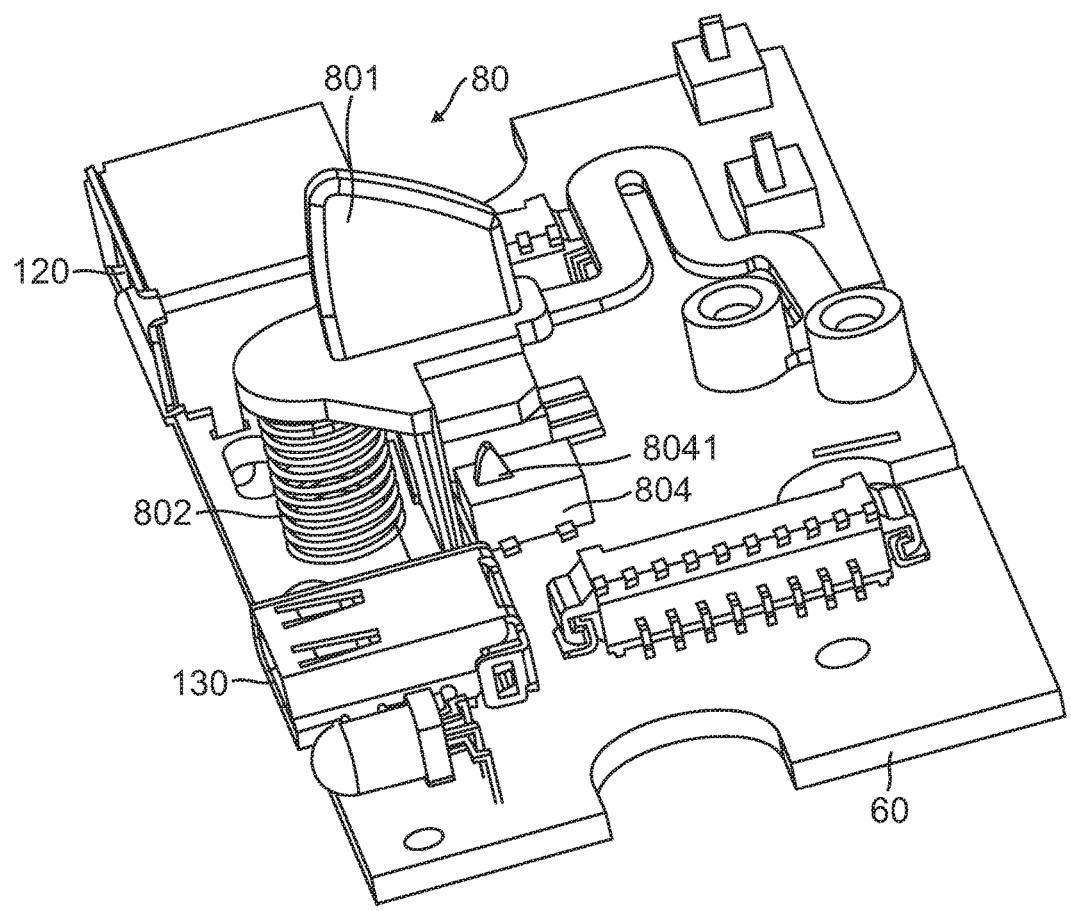
FIG. 6 is an interior top and side perspective view of the overall configuration of the pushbutton automatic reset travel switch assembly connected to the master circuit board.
Figure 7:
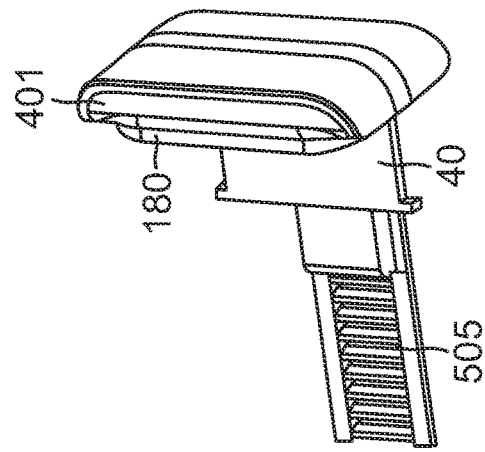
FIG. 7 is a front separated exploded view of the overall structure of the rack and pinion transmission mechanism.
Figure 7:
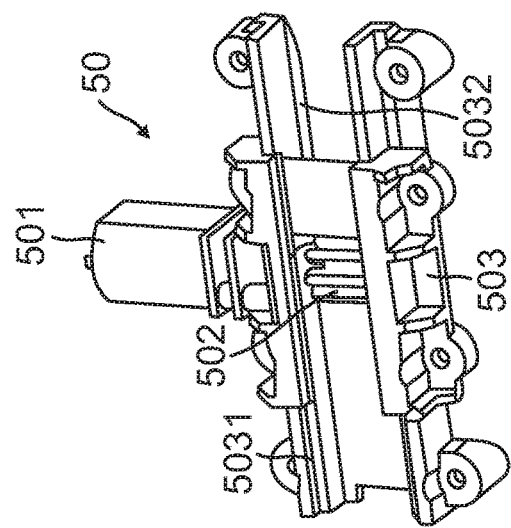
Figure 7:
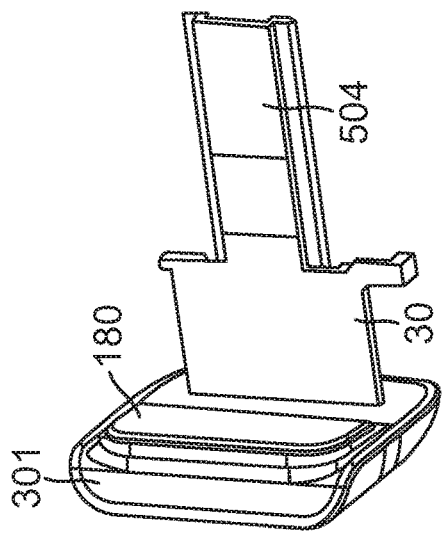

The first travel switch 803 and the second travel switch 804 are arranged side-by-side from left to right. Referring to FIG. 5, the first travel switch 803 lower portion has a first elastic button 8031 (FIG. 5) movable to the left. Referring to FIG. 6, the second travel switch 804 front portion has a second elastic button 8041 which has a rearward movement. A resisting plate 805 with a gradually decreasing width is set at the back of pressing block 801. A left side of the resisting plate 805 and a right side of the first elastic button 8031 have a gap therebetween. Referring to FIGS. 5 and 6, the rear end surface of the pressing block 801 abuts to the position of the second elastic button 8041. The front end surface of the main control circuit board 60 is provided with an opening slot 601 opposite to the position of the resisting plate 805, which is adapted to pass through when the resisting plate 805 moves backward.

When the mobile phone is attached to the front end surface of the housing 10 and the pressing block 801 is pressed, then the pressing block 801 drives the resisting plate 805 to move backward. The resisting plate 805 moves 0.2 mm rearwardly when responding to the first stroke. The left side of the resisting plate 805 abuts to the right side of the first elastic button 8031. When the resisting plate 805 is moved backward 3 mm responsive to the second stroke, the rear end surface of the pressing block 801 abuts to the second elastic button 8041.

The stroke of the first elastic button 8031 moving to the left and the stroke of the second elastic button 8041 moving backward are both 0.3 mm.

In this way, when the user needs to affix the user's mobile phone to the holder, the user attaches the mobile phone to the front-end surface of the housing 10 with one hand. When the user presses the mobile phone to the front-end surface of the housing 10 with one hand, the phone will press against the pressing block 801 protruding from the front-end surface of the housing 10. In this procedure, the pressing block 801 drives the resisting plate 805 to move backward and the resisting plate 805 moves backwards. In the first stroke of 0.2 mm, when the resisting plate 805 is moving backwards, the left side of the resisting plate 805 abuts to the right side of the first elastic button 8031. In the second stroke of 3 mm, when the resisting plate 805 is moving backwards, the rear end surface of the pressing block 801 abuts to the second elastic button 8041. When the rear end surface of the pressing block 801 abuts to the second elastic button 8041, the preset stroke of 3.2 mm is pressed. At this point, the first elastic button 8031 and the second elastic button 8041 are both in a pressed state so that a first feedback signal is sent to the main controller 70. In response to the first feedback signal, the master controller 70 controls the transmission mechanism 50 in gear rack 502 to drive the left clamping arm 30 and right clamping arm 40 to synchronously move towards each other. In this way, the left clamping portion 301 and right clamping portion 401 securely grip and hold the mobile phone.

When the user needs to retrieve the mobile phone, the user only needs to lift the mobile phone with one hand. When the user lifts the mobile phone with one hand, the pressing force of the pushbutton automatic reset travel switch assembly 80 is reduced and the pushbutton automatic reset travel switch assembly 80 moves in the reverse direction to provide a second feedback signal to be sent to the main controller 70. This causes the transmission mechanism 50 in gear rack 502 to control the left clamping portion 301 and right clamp portion 401 and to synchronously move away from each other. In this way, left clamping portion 301 and right clamping portion 401 release the mobile phone.

When the user attempts to affix the user's mobile phone to the mobile phone holder and the preset stroke is less than 3.2 mm, this indicates that the user's mobile phone has not been put in place properly and the arms will not grasp the mobile phone. Therefore, the present invention is able to recognize whether the phone is properly fit in place or when it is not properly fit in place.

When the present invention is affixed to the vehicle center console and its periphery by the fixing base 20, as long as the vibration impacts are less than 3.2 mm, the present invention can withstand the impact and the mobile phone will not come loose.

Referring to FIG. 3, the transmission mechanism 50 in gear rack 502 includes a reduction gear motor 501 disposed in an up-and-down direction, a gear 502 sleeved on a rotating shaft of the lower end of the reduction gear motor 501, and a slide rail bracket gear 503 covering gear rack 502 fixed in middle of housing 10 in a left-right direction. A front rack 504 is set inside the left of the slide rail bracket gear 503 and slidable from left to right along the inside front of slide rail bracket gear 503, and a back rack 505 set inside the right of the slide rail bracket gear 503 and slidable from left to right along the inside back slide rail bracket gear 503.

Further referring to FIG. 3, the right end of the left clamping arm 30 is integrally connected with the left end of the front rack 504. The left end of the right clamping arm 40 is connected with the right end of the rear rack 505 to form an integral body. The rear end surface of the front rack 504 meshes with the front end of gear rack 502. The front end of back rack 505 meshes with front end of gear rack 502.

In this way, the front rack 504 and the rear rack 505 synchronously move to drive the left clamping arm 30 and the right clamping arm 40 to move in opposite directions to clamp the mobile phone and the front rack 504, and the rear rack 505 are synchronized in a backward motion to urge the left clamping arm 30 and the right clamping arm 40 to move back in synchronization to release the mobile phone.

Figure 8:
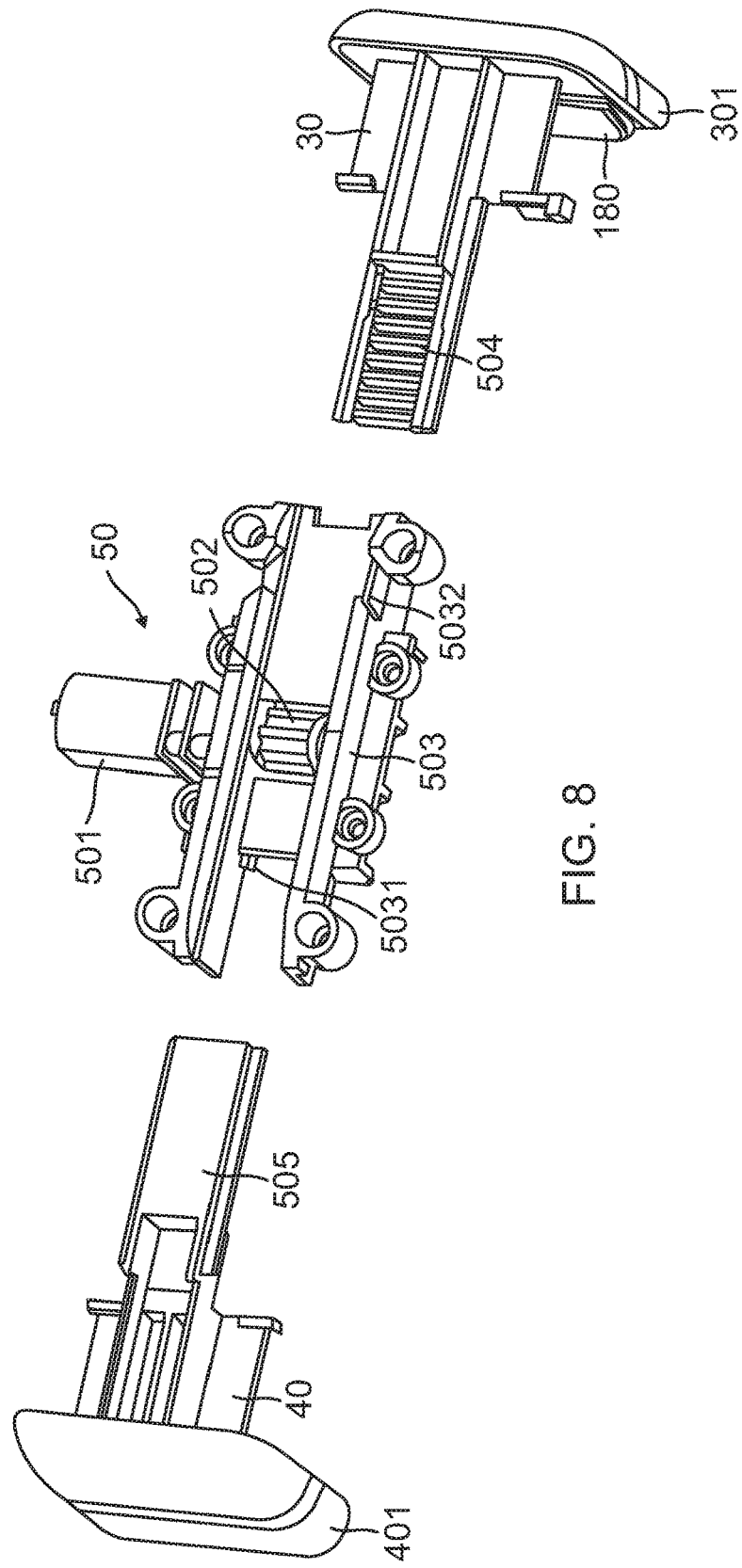
FIG. 8 is a rear separated exploded view of the overall structure of the rack and pinion transmission mechanism.

Referring to FIG. 8, the front-end surface of the slide rail bracket 503 is provided with a first sliding slot 5031 in the left-right direction, and a second sliding slot 5032 is disposed in the left-right direction of the rear end surface. The front rack 504 is slidable to the sliding slot 5031 left-to-right and the rear rack 505 is slidable on the second sliding groove 5032 left-to-right. Therefore, each is provided with a sliding limit to prevent excess sliding to prevent displacement of the respective slide rail.

Figure 4:
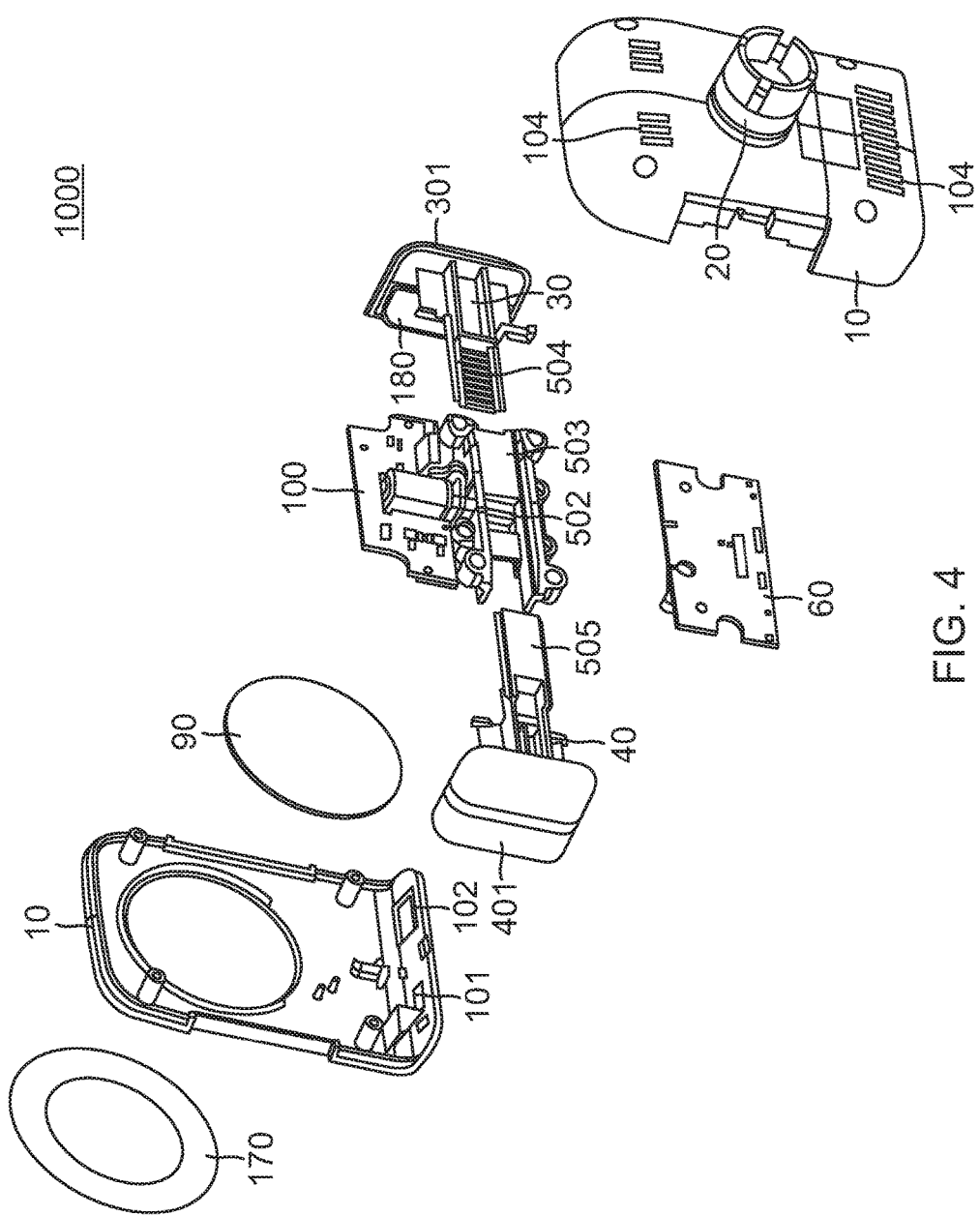
FIG. 4 is an alternative exploded view of the present invention housing having the automatic mobile phone grasping arms.

Referring to FIG. 3, a wireless charging coil 90 is affixed to the front inner side of the housing 10. A wireless charging board 100 is affixed to the upper part of the housing 10 and the wireless charging board 100 has a wireless charging circuit 110 connecting main controller 70 and wireless charging coils 90. The main control circuit board 60 is further provided with a charging interface 120 and a USB output interface 130 connected to the main controller 70. Referring to FIG. 4, the lower bottom surface of the housing 10 exposes the first charging port 101 of charging interface 120 and second charging port 102 of charging interface for USB output 130.

Therefore, the present invention can be provided with power by connecting the charging interface 120 to a car cigarette lighter or other power supply output with a power cable. Also, the wireless charging coil 90 is affixed to the front inner side of the housing 10. Therefore, the present invention can be used as a power adapter so it can be used for multiple applications. This also eliminates the need to connect charging cables to a user's mobile phone, thereby making the present invention a wireless charger. Moreover, an external electronic product is connected through the USB output interface 10. Therefore, the present invention can supply wired power to an external electronic product.

Figure 9:
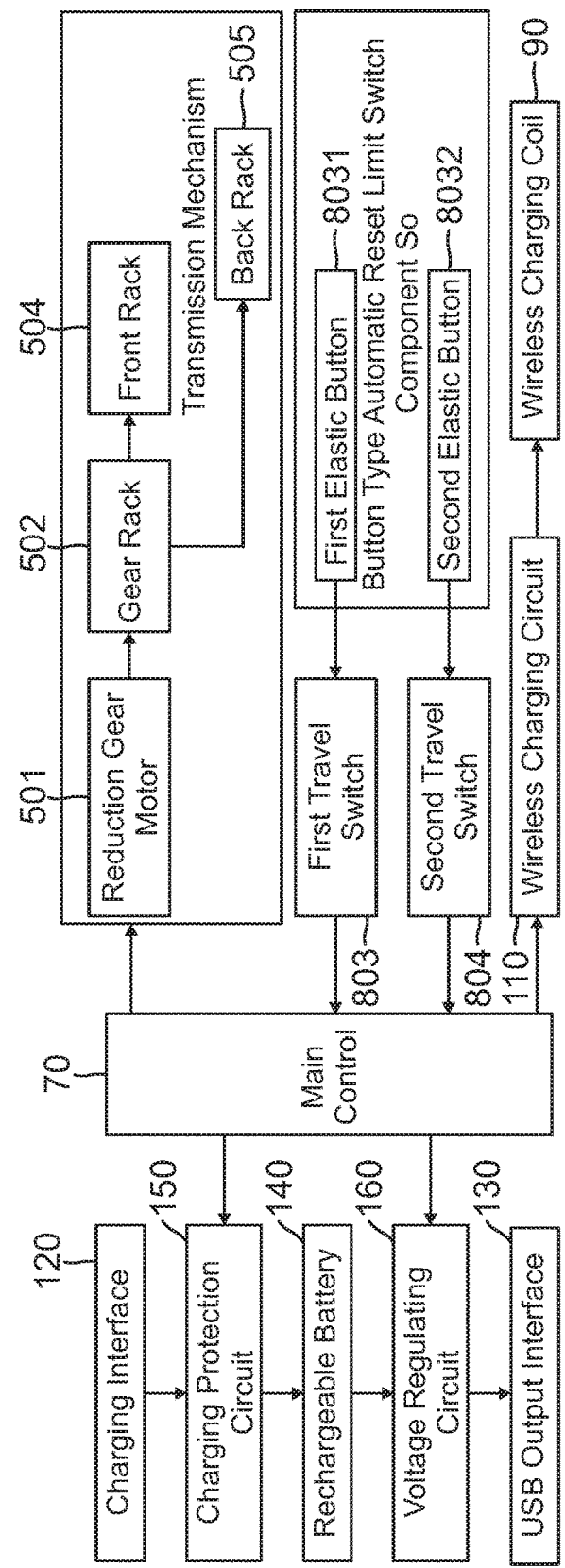
FIG. 9 is a circuit block diagram of the present invention automatically sensing mobile phone holder.
Figure 10:
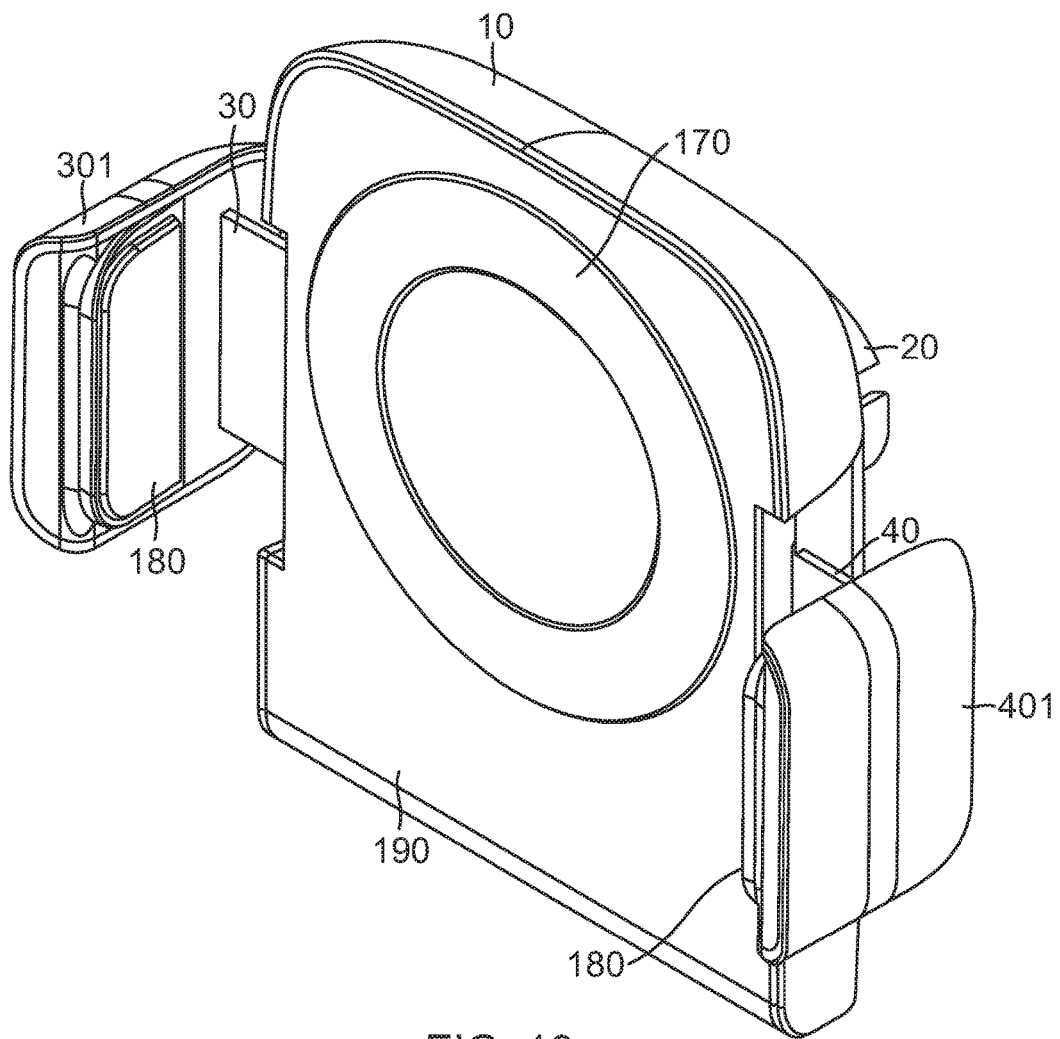
FIG. 10 is a perspective view of a second embodiment of the present invention automatic mobile phone holder grasping arms and location where the mobile phone holder retains a mobile phone with a flat planar surface.

Referring to FIG. 9, the present invention housing 10 is provided with a rechargeable battery 140 and the main control circuit board 60 is further provided with a charging protection circuit 150 and a voltage regulating circuit 160. The charging protection circuit 150 is connected between the charging interface 120 and the rechargeable battery 140. The voltage regulating circuit 160 is connected between the rechargeable battery 140 and the wireless charging coil 90. The charging protection circuit 150 and the voltage regulating circuit 160 are also respectively connected to the main controller 70.

Since the rechargeable battery 140 is further located in the housing 10, the present invention can also be used as a mobile power source.

Referring to FIG. 3, an annular groove 103 is formed in the middle of the front-end surface of housing 10, and a non-slip rubber gasket 170 is fixed in the annular groove 103. The right end surface of the left clamping arm 301 and a left end surface of the right clamping arm 40 respectively have a fixed non-slip rubber pad 180. In this way, when the user secures the mobile phone to the present invention, the non-slip rubber gasket 170 abuts against the back of the user's mobile phone. The two non-slip rubber pads 180 correspond to the two sides of the user's mobile phone, so that the user's mobile phone can be clamped to prevent the user's mobile phone from slipping off. The non-slip rubber gasket 170 and the two non-slip rubber pads 180 can also protect the user's mobile phone to isolate the user's mobile phone from the housing 10, the left clamping portion 301 and the right clamping portion 401 to avoid wear on the back side and both sides of the user's mobile phone.

Embodiment 2

In FIG. 5 through FIG. 10, referring initially to FIG. 3-FIG. 4, the present invention mobile phone holder 1000 is illustrated automatically holding or releasing a mobile phone 5000 which comprises a housing 10 provided with an extended opening in the middle and front sides of the left and right sides, and a fixing base 20 disposed at the rear of the housing 10. Housing 10 extends from the left housing outlet extending clamping arm 30 through the housing to the right side housing outlet extending clamping arm 40. Housing 10 also includes transmission mechanism 50 in gear rack drive 502 which drives the left clamping arm 30 and the right clamping arm 40 with synchronized movement either away from each other or synchronized movement toward each other. The alternative embodiment of the mobile phone holder also includes a main circuit board 60 within the housing 10, the main controller 70 in the main circuit board 60 driving the transmission mechanism 50 in gear rack 502 in main controller 70, the pushbutton automatic reset travel switch assembly 80 for detecting the mobile phone extending from the front end of housing 10, and a pressing panel 190 fixed to the pushbutton automatic reset travel switch assembly 80 that is open to the front end surface of the housing 10 and the lower bottom surface.

The left end of the left clamping arm 30 has a left clamping portion 301 protruding forwardly for clamping the mobile phone. The right end of the right clamping arm 40 has a right clamping member 401 protruding forward for clamping the mobile phone. To the right of left clamping arm 30 and left of right clamping arm 40 respectively interlock the transmission mechanism 50 in gear rack 502. The transmission mechanism 50 in gear rack 502 and the pushbutton automatic reset limit switch component 80 are respectively connected with the main controller 70.

In the initial state, the left clamping arm 30 and the right clamping arm 40 are in an extended condition when the mobile phone is placed to fit in the front surface of the housing 10. The pressing panel 190 is then pressed by the mobile phone, and the attached pushbutton automatic reset travel switch assembly 80 gives a first feedback signal of 3.2 mm to the master controller 70 after being pressed. In response to the first feedback signal, the master controller 70 controls the transmission mechanism 50 in gear rack 502 to drive the left clamping arm 30 and right clamping arm 40 to synchronously move towards each other so the left clamping portion 301 and right clamping portion 401 can separately grip and hold the mobile phone.

When the mobile phone is lifted slightly, the pressing force of pressing panel 190 is reduced, and pressing force on the attached pushbutton automatic reset travel switch assembly 80 is reduced, so the automatic reset travel switch assembly 80 rebounds. The pushbutton automatic reset travel switch assembly 80 now triggers a second feedback signal of 3.2 mm and the signal is sent to the main controller 70. In response to the second feedback signal, the main controller 70 controls the transmission mechanism 50 in the gear rack to drive the left clamping arm 30 and right clamping arm 40 to synchronously move against each other.

In this way, the left clamping portion 301 and right clamping portion 401 releases the mobile phone 5000.

The difference between Embodiment 1 and Embodiment 2 is that the front end and bottom back surface of the housing 10 in Embodiment 1 is replaced with an L-shape pressing panel 190 fixed to the pushbutton automatic reset travel switch assembly 80 with front-end and bottom back surface. In this embodiment, the principle of the left clamping arm 30 and the right clamping arm 40 automatically opening and closing remains the same.

The result differs in that the pushbutton automatic reset travel switch assembly 80 is built-in and hidden. From the front perspective view, the front end surface of the present invention is a planar structure or a bear-planar structure. No pressing-type physical component can be seen from the front surface like left and right mouse buttons, which creates an aesthetic elegant look.

In the second embodiment, the pushbutton automatic reset travel switch assembly 80 is composed of a pressing block 801, a fixing spring 802 connected between the rear end surface of the pressing block 801 and the front-end surface of the main control circuit board 60, a first travel switch 803 connected to the main controller 70 which is set in an up-and-down direction at the front end of the main circuit board 60, and a second travel switch 804 connected to the main controller 70 which is set in an up-and-down direction at the front end of the main control circuit board 60.

The rear end surface of the pressing panel 190 is fixedly connected to the front portion of the pressing block 801. The first travel switch 803 and the second travel switch 804 are arranged side-by-side from left to right. The first travel switch 803 lower portion has a first elastic button 8031 movable to the left and the second travel switch 804 front portion has a second elastic button 8041 having a rearward movement. A resisting plate 805 with a gradually decreasing width is set at the back of pressing block 801 and a left side of the resisting plate 805 and a right side of the first elastic button 8031 have a certain gap therebetween. The rear end surface of the pressing block 801 abuts to the position of the second elastic button 8041 and the front end surface of the main control circuit board 60 is provided with an opening slot 601 (see FIG. 5) which abuts to the resisting plate 805 which is adapted to pass through when the resisting plate 805 moves backward.

When the mobile phone is attached to the pressing panel 190, and the pressing block 801 is pressed, the pressing block 801 drives the resisting plate 805 to move backward. When the resisting plate 805 moves rearwardly 0.2 mm of the first stroke, the left side of the resisting plate 805 abuts to the right side of the first elastic button 8031. When the resisting plate 805 is moved backwardly 3 mm of the second stroke, the rear end surface of the pressing block 801 abuts to the second elastic button 8041.

The stroke of the first elastic button 8031 moving to the left and the stroke of the second elastic button 8041 moving backward are both 0.3 mm.

In this way, when the user presses the mobile phone to the front-end surface of the housing 10 with one hand, the phone will press against the pressing block 801 protruding from the front-end surface of the housing 10. In this procedure, the pressing block 801 drives the resisting plate 805 to move backward by 0.2 mm for the first stroke. When the resisting plate 805 is moving backwards, the left side of the resisting plate 805 abuts to the right side of the first elastic button 8031. In the second stroke of 3 mm, when the resisting plate 805 is moving backwards, the rear end surface of the pressing block 801 abuts to the second elastic button 8041.

When the rear end surface of the pressing block 801 abuts to the second elastic button 8041, the first preset stroke is pressed, that is 3.2 mm. At this time, the first elastic button 8031 and the second elastic button 8041 are both in a pressed state, so that a first feedback signal is sent to the main controller 70 according to the first feedback signal. The master controller 70 controls the transmission mechanism 50 in gear rack 502 to drive the left clamping arm 30 and right clamping arm 40 to synchronously move towards each other, so the left clamping portion 301 and right clamping portion 401 can grip and hold the mobile phone securely.

When the user needs to retrieve the mobile phone, the user only needs to lift the mobile phone with one hand. When the user lifts the mobile phone with one hand, the pressing force of the pushbutton automatic reset travel switch assembly 80 is reduced, and the pushbutton automatic reset travel switch assembly 80 rebounds. When the second preset stroke equal 3.2 mm, a second feedback signal will be sent back to the main controller 70. According to the second feedback signal, the main controller 70 drives the transmission mechanism 50 in gear rack 502 to control the left clamping portion 301 and right clamp portion 401 synchronously move away from each other. In this way, left clamping portion 301 and right clamping portion 401 release the mobile phone.

As in the first embodiment, a minimum 3.2 mm force is required to affix the user's mobile phone. The 3.2 mm for the first preset stroke causes a pushbutton automatic reset travel switch assembly to move 3.2 mm for the clamping arms to clamp the mobile phone. If the force is less than 3.2 mm, this indicates that the mobile phone is not properly set in the housing and the clamping arms will not clamp the phone.

When the mobile phone is properly affixed in the housing and is on a vehicle center console and its periphery by the fixing base 20, even if the car has a certain bump and/or vibration or shaking during the running process, as long as the mobile phone rebound stroke of the present invention is less than 3.2 mm, the present invention can adapt and retain the mobile phone. This also allows the present invention to not work by mistake due to a slight shaking to the mobile phone.

In the second embodiment, the transmission mechanism 50 in gear rack 502 includes a reduction gear motor 501 disposed in an up and down direction, a gear 502 sleeved on a rotating shaft of the lower end of the reduction gear motor 501, a slide rail bracket gear 503 covering gear rack 502 fixed in middle of housing 10 in a left-right direction, a front rack 504 set inside the left of the slide rail bracket gear 503 and slidable from left to right along the front inside of slide rail bracket gear 503, and a back rack 505 set inside the right of the slide rail bracket gear 503 and slidable from left to right along back inside of the slide rail bracket gear 503.

The right end of the left clamping arm 30 is integrally connected with the left end of the front rack 504 and the left end of the right clamping arm 40 is connected with the right end of the rear rack 505 to form an integral body. The rear end surface of the front rack 504 meshes with the front end of gear rack 502, and the front end of back rack 505 meshes with front end of gear rack 502.

In this way, the front rack 504 and the rear rack 505 synchronously move to drive the left clamping arm 30 and the right clamping arm 40 to move in opposite directions to clamp the mobile phone. In addition the front rack 504 and the rear rack 505 are synchronized in a backward motion to urge the left clamping arm 30 and the right clamping arm 40 to move back in synchronization to release the mobile phone.

The front end surface of the slide rail bracket 503 is provided with a first sliding slot 5031 in the left-right direction, and a second sliding slot 5032 is disposed in the left-right direction of the rear end surface. The front rack 504 is slidable to the sliding slot 5031 left-to-right and the rear rack 505 is slidable on the second sliding groove 5032 left-to-right so they having a sliding limit without displacement.

In the second embodiment, a wireless charging coil 90 is affixed to the front inner side of the pressing panel 190. A wireless charging board 100 is affixed to the upper part of the housing 10. The wireless charging board 100 has wireless charging circuit 110 connecting main controller 70 and wireless charging coils 90. The main control circuit board 60 is further provided with a charging interface 120 and a USB output interface 130 connected to the main controller 70. The main controller 70 includes a lower bottom surface of the housing 10 which exposes the first charging port 101 of charging interface 120 and second charging port 102 of charging interface for USB output 130.

Therefore, the present invention can be provided with power by connecting the charging interface 120 and car cigarette lighter or other power supply output with a power cable. On the other hand, a wireless charging coil 90 is affixed to the front inner side of the housing 10 in the present invention. Therefore, the present invention can be used as a power adapter so it can be used in multiple applications. This eliminates the need for charging cables connected to a user's phone. Moreover, any external electronic product requiring power can be connected through the USB output interface 130 so that the present invention can supply wired power to the external electronic product.

In the second embodiment, the housing 10 is provided with a rechargeable battery 140, and the main control circuit board 60 is further provided with a charging protection circuit 150 and a voltage regulating circuit 160. The charging protection circuit 150 is connected between the charging interface 120 and the rechargeable battery 140. The voltage regulating circuit 160 is connected between the rechargeable battery 140 and the wireless charging coil 90. The charging protection circuit 150 and the voltage regulating circuit 160 are also respectively connected to the main controller 70. Since the rechargeable battery 140 is further retained in the housing 10, the present invention can also be used as a mobile power source, so that the function is more comprehensive.

Annular groove 103 is formed in the middle of the front-end surface of the pressing panel 190, and a non-slip rubber gasket 170 is fixed in the annular groove 130. The right end surface of the left clamping arm 301 and a left end surface of the right clamping arm 40 have a fixed non-slip rubber pad 180 respectively. In this way, when the user secures the mobile phone to the present invention, the non-slip rubber gasket 170 abuts against the back of the user's mobile phone. The two non-slip rubber pads 180 correspond to the two sides of the user's mobile phone so that the user's mobile phone can be well clamped to prevent the user's mobile phone from slipping off. Further, the non-slip rubber gasket 170 and the two non-slip rubber pads 180 can also protect the user's mobile phone to isolate the user's mobile phone from the housing 10 to avoid wear on the back side and both sides of the user's mobile phone.

It should be noted that, for both Embodiment 1 and Embodiment 2, the back surface of the housing 10 in the present invention is provided with a heat dissipation vent. The fixing base 20 on the back surface of housing 10 in the present invention can be connected to a conventional universal ball socket holder having clamping members for insertion into the air vent in a vehicle.

Other embodiments are not listed and described here one-by-one. In summary, the present invention has the advantages of simple structure, easy implementation, easy operation, strong practicability, strong specificity and low manufacturing cost.

Of course the present invention is not intended to be restricted to any particular form or arrangement, or any specific embodiment, or any specific use, disclosed herein, since the same may be modified in various particulars or relations without departing from the spirit or scope of the claimed invention hereinabove shown and described of which the apparatus or method shown is intended only for illustration and disclosure of an operative embodiment and not to show all of the various forms or modifications in which this invention might be embodied or operate.

What is claimed is:

1. An apparatus comprising:
   a. a mobile phone holder having a housing to automatically hold or release a mobile phone;
   b. said housing formed with an extended opening in a middle of a left side and a right side of said housing with said housing having a housing front surface and a housing bottom surface;
   c. a fixing base at the back of said housing, a left clamping arm extending from the left side of the housing, and a right clamping arm extending from the right side of the housing;
   d. a rack and pinion transmission mechanism in the housing; a main control circuit board in the housing, a main control in the main circuit board electrically connected to said rack and pinion transmission mechanism; and
   e. a pushbutton automatic reset travel switch assembly for detecting a mobile phone in the housing;
   f. said rack and pinion mechanism drive, said left clamping arm and said right clamping arm synchronously move said left clamping arm and said right clamping arm towards each other or away from each other; and
   g. wherein, when the mobile phone is placed to fit in a front surface of the housing and thereby presses a pushbutton automatic reset travel switch assembly, the pushbutton automatic reset travel switch assembly sends a first feedback signal to move said left clamping arm and said right clamping arm towards each other;
   h. wherein, when the mobile phone is removed from the front surface of the housing, the pushbutton automatic reset travel switch assembly sends a second feedback signal to move said left clamping arm and said right clamping arm away from each other.

2. The apparatus in accordance with claim 1, further comprising: said left clamping arm and said right clamping arm are connected to the gear rack transmission mechanism and the pushbutton automatic reset stroke switch assembly is connected to the main control.

3. The apparatus in accordance with claim 1, further comprising: in an initial state, the left clamping arm and the right clamping arm are in an extended state.

4. The apparatus in accordance with claim 1, further comprising: said housing having a wireless charging coil affixed to a front inner wall of said housing front surface.

5. The apparatus in accordance with claim 1, further comprising: when the mobile phone is removed from said housing front surface, the pressing force on the pushbutton automatic reset travel switch assembly is reduced, and the pushbutton automatic reset travel switch assembly triggers a second feedback signal of a preset stroke and said second feedback signal is sent to the main controller.

6. The apparatus in accordance with claim 1, further comprising: said pushbutton automatic reset travel switch assembly includes a pressing block extending from the housing and a fixing spring connected between the pressing block and the control circuit board.

7. The apparatus in accordance with claim 1, further comprising: at least one travel switch connected to the main controller set in an up-and-down direction and located on the main control circuit board.

8. The apparatus in accordance with claim 1, further comprising: the rack and pinion transmission mechanism includes a reduction gear motor disposed in an up and down direction.

9. The apparatus in accordance with claim 1, further comparing:
   a. a wireless charging coil affixed to the front inner side of the pressing panel,
   b. a wireless charging board is affixed to the upper part of the housing, the wireless charging board having a wireless charging circuit connecting the main controller and wireless charging coils; and
   c. the main control circuit board is further provided with a charging interface and a USB output interface connected to the main controller, and on the lower bottom surface of the housing exposes the first charging port of charging interface and a second charging port of charging interface for a second USB output.

10. The apparatus in accordance with claim 9, further comprising:
    a. the housing is provided with a rechargeable battery;
    b. the main control circuit board is further provided with a charging protection circuit and a voltage regulating circuit;
    c. the charging protection circuit is connected between the charging interface and the rechargeable batter;
    d. the voltage regulating circuit is connected between the rechargeable battery and the wireless charging coil; and
    e. the charging protection circuit and the voltage regulating circuit are also respectively connected to the main controller.

11. The apparatus on accordance with claim 9:
    a. an annular groove is formed in the middle of the front-end surface of the pressing panel; and
    b. a non-slip rubber gasket is fixed in the annular groove.

12. An apparatus comprising:
    a. a mobile phone holder having a housing to automatically hold or release a mobile phone;
    b. said housing formed with an extended opening in a middle of a left side and a right side of said housing, said housing having a housing front surface and a housing bottom surface;
    c. right end surface of a left clamping arm and a left end surface of a right clamping arm each having a fixed non-slip rubber pad and a fixing base at a back of said housing, a left clamping arm extending from the left side of the housing, and a right clamping arm extending from the right side of the housing;
    d. a rack and pinion transmission mechanism in the housing, a main control circuit board in the housing, a main control in the main circuit board electrically connected to said rack and pinion transmission mechanism; and
    e. a pushbutton automatic reset travel switch assembly for detecting a mobile phone in the housing;
    f. wherein, when the mobile phone is placed to fit in the front surface of the housing and the pushbutton automatic reset travel switch assembly is pressed by the mobile phone, the pushbutton automatic reset travel switch assembly sends a first feedback signal to move said left clamping arm and said right clamping arm towards each other;
    g. wherein, when the mobile phone is removed from the front surface of the housing, the pushbutton automatic reset travel switch assembly sends a second feedback signal to move said left clamping arm and said right clamping arm away from each other.

* * * * *